United States Patent [19]
Ley et al.

[11] 4,047,053
[45] Sept. 6, 1977

[54] ANALOGUE STORAGE CIRCUIT INCLUDING CHARGE TRANSFER DEVICE WITH COMPENSATION LOOP

[75] Inventors: Anthony John Ley, New Canaan, Conn.; Eric Metcalf, Ropley, England

[73] Assignee: The Solartron Electronic Group Limited, Farnborough, England

[21] Appl. No.: 602,161

[22] Filed: Aug. 6, 1975

[30] Foreign Application Priority Data

Aug. 10, 1974 United Kingdom ............... 35328/74
Sept. 7, 1974 United Kingdom ............... 39186/74

[51] Int. Cl.$^2$ ............................................. H01L 27/10
[52] U.S. Cl. ................... 307/238; 307/221 D; 340/347 M; 340/347 R; 357/24
[58] Field of Search ............... 307/221 D, 304, 221 C; 357/24; 340/347 AD, 347 DA, 15 GC, 347; 333/70 T

[56] References Cited

U.S. PATENT DOCUMENTS

| 3,916,219 | 10/1975 | Wilmsmeyer | 307/221 C |
| 3,937,985 | 2/1976 | Cooper | 307/304 |

OTHER PUBLICATIONS

Heller et al., "Charge Transfer Compensation Circuit," IBM Technical Disclosure Bulletin, vol. 16, No. 10, Mar. 1974, pp. 3164, 3165.

*Primary Examiner*—Thomas J. Sloyan
*Attorney, Agent, or Firm*—William R. Sherman; Kevin McMahon; Martin M. Novack

[57] ABSTRACT

The analogue storage circuit includes a charge transfer device such as a charge-coupled device (CCD) and a quantizing circuit. The charge transfer device is arranged to shift an analogue signal from its input to its output, the analogue signal being subject to a change in magnitude during such shifting.

The quantizing circuit receives the analogue signal from the output of the charge transfer device and quantizes that signal at a respective one of several substantially discrete levels. The quantizing circuit is arranged to apply the quantized analogue signal to the input of the charge transfer device, whereby in operation the analogue signal is circulated round the loop defined by the charge transfer device and the quantizing circuit. The quantizing circuit is further arranged to quantize the analogue signal, upon each subsequent receipt thereof, at the same one of the discrete levels. The storage circuit is provided with an input for introducing the analogue input signal to be stored, into the loop defined by the charge transfer device and the quantizing circuit.

23 Claims, 7 Drawing Figures

ANALOGUE STORAGE CIRCUIT INCLUDING CHARGE TRANSFER DEVICE WITH COMPENSATION LOOP

This invention relates to analogue storage circuits, and is more particularly concerned with analogue storage circuits including at least one charge-transfer device.

Charge-transfer devices are multi-stage devices having an input, whereby an analogue signal in the form of a charge may be introduced into a stage of the device, an output, and means whereby the charge can be shifted from stage to stage within the device from its input to its output. A typical example of a charge-transfer device is a charge-coupled device (CCD), which is a type of integrated circuit device having a plurality of closely-spaced control electrodes, the charge being introduced into the device under one of these electrodes and then shifted from electrode to electrode therein by applying suitable control signals to the electrodes.

It is known that a charge-transfer device such as a CCD can be used as an analogue storage circuit, by connecting its output to its input and continuously recirculating the charge through the device. However, as the charge is shifted from stage to stage within the device, its magnitude is changed, typically reduced, by a small but significant amount. A typical CCD may have one hundred stages, and a transfer efficiency of about 99.9% to 99.99% for each transfer of the charge between two adjacent stages, so it will be appreciated that the analogue information represented by the charge will become significantly degraded after very few recirculations through the device. It is an object of the present invention to provide an analogue storage circuit employing a charge transfer device, which circuit substantially alleviates the aforementioned problem of the degradation of the analogue signal.

According to one aspect of the present invention, therefore, an analogue storage circuit comprises:

a charge transfer device having an input whereby an analogue signal may be introduced into the device, an output, and means whereby the analogue signal may be shifted from the input to the output, the analogue signal being subject to a change in magnitude during said shifting;

a quantising circuit for receiving the analogue signal from the output of the charge transfer device and for quantising the received analogue signal at a respective one of a plurality of substantially discrete levels, the quantising circuit being arranged to apply the quantised analogue signal to the input of the charge transfer device, whereby in operation the analogue signal is circulated round the loop defined by the charge transfer device and the quantising circuit, the quantising circuit being further arranged to quantise the analogue signal, upon each subsequent receipt thereof, at the same one of said discrete levels; and input means for introducing an analogue input signal to be stored into the loop defined by the charge transfer device and the quantising circuit.

According to another aspect of the present invention, a multiple stage analogue storage system comprises N storage circuits in accordance with the preceding statement of invention, where $N \geq 2$, connected in cascade by $(N-1)$ analogue subtracting circuits each having two inputs and an output which is connected to the input of a respective analogue multiplying circuit having a respective multiplying factor greater than unity, the two inputs of each subtracting circuit being respectively connected to receive the analogue input signal and the quantised signal from the preceding storage circuit, and the output signal from each multiplying circuit constituting the analogue input signal for the succeeding storage circuit, whereby portions of the analogue input signal to be stored, which portions are of successively decreasing significance, are stored in successive ones of the storage circuits.

According to yet another aspect of the present invention, there is provided a non-linear amplifying circuit for amplifying an input signal, comprising a plurality of signal level responsive circuits each responsive to the input signal to change from a first state to a second state in the region of a respective predetermined level of the input signal, said predetermined levels being different for each signal level responsive circuit, and summing means responsive to said signal level responsive circuits to produce an output signal whose level is dependent upon the number of said signal level responsive circuits in a given one of said states.

According to yet a further aspect of the present invention, there is provided a non-linear amplifying circuit for amplifying an input voltage, comprising:

means for generating a sequence of predetermined voltages, each predetermined voltage being higher than the preceding one in the sequence;

a plurality of voltage level responsive circuits each connected to receive the input signal and a respective one of said predetermined voltages and each arranged to change from a first state to a second state as the input voltage passes through a level of equality with the respective predetermined voltage in a given direction;

an output circuit for producing an output voltage; and a plurality of voltage follower circuits each having a first input connected to receive a respective one of said predetermined voltages and an output connected to the input of the output circuit, each voltage follower circuit being arranged to be rendered operative by a respective one of said voltage level responsive circuits when the input voltage lies between the respective predetermined voltage received by that voltage level responsive circuit and the next successive predetermined voltage in said given direction, and each voltage follower circuit being arranged, when operative, to co-operate with the output circuit to maintain the output voltage substantially equal to the respective voltage at the first input of the voltage follower circuit.

The invention will now be described, by way of example only, with reference to the accompanying drawings, of which:

Figure 1:
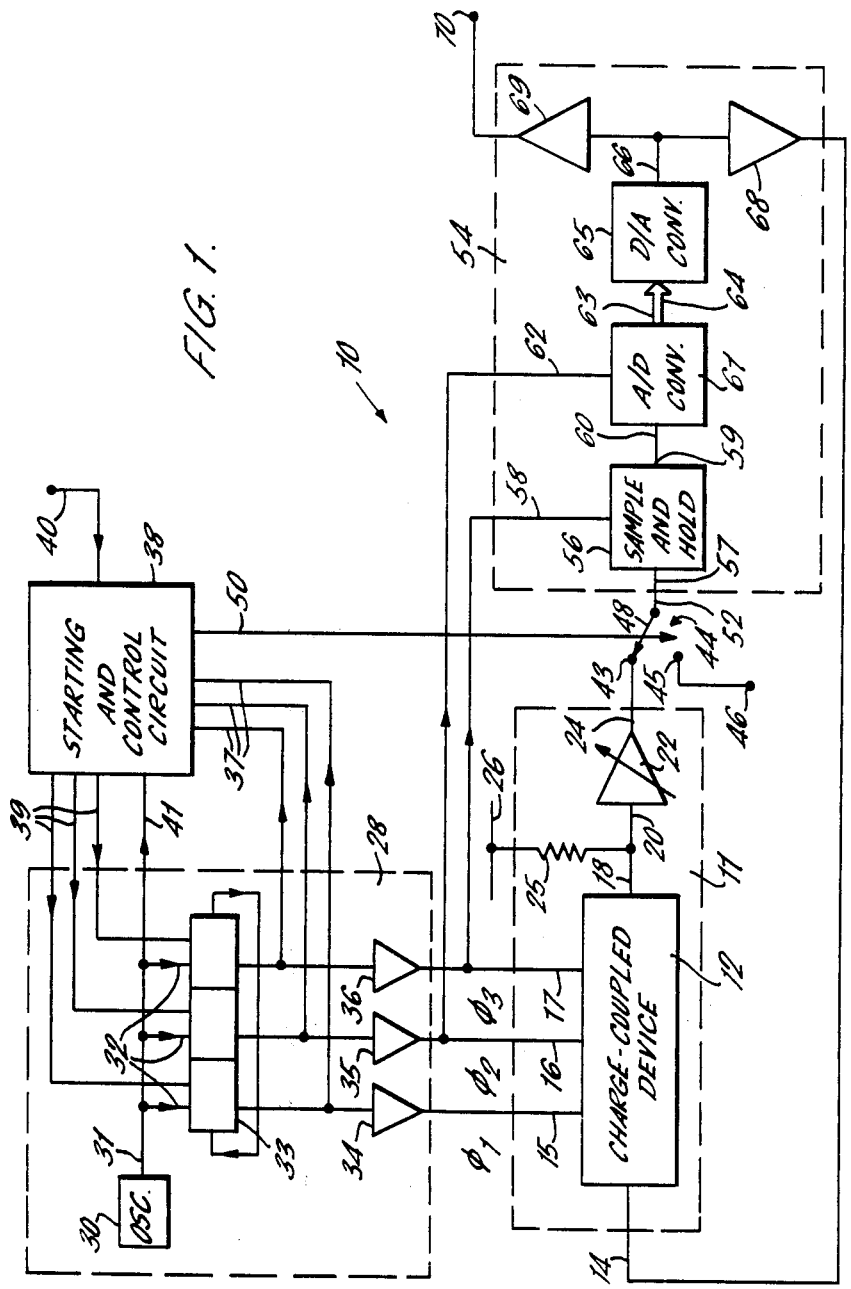
FIG. 1 is a block circuit diagram of an analogue storage circuit in accordance with the present invention.

The analogue storage circuit of FIG. 1 is indicated generally at 10, and comprises a charge-transfer device 11 basically comprising a charge-coupled device (CCD) 12. For illustrative purposes, the CCD 12 will be assumed to be a type CD00 CCD, as manufactured by GEC Semiconductors Limited of East Lane, Wembly, Middlesex, England, although it will be appreciated that other suitable types of CCD may be used. Thus the CCD 12 is a one hundred element CCD, having an array of 300 closely spaced control electrodes (not shown), each group of three adjacent electrodes defining an element of the CCD. The CCD 12 has a signal input 14 which is associated with the first element thereof, and which also constitutes the input of the charge transfer device 11, three clock inputs 15, 16, 17 each connected to a respective one of the three electrodes in each element thereof, and an output 18 associated with the last element thereof. The output 18 is connected to the input 20 of an adjustable gain amplifier 22, whose output 24 constitutes the output of the charge transfer device 11, and, via an output load resistor 25, to a positive voltage supply rail 26.

The clock inputs 15, 16, 17 are connected to a three-phase clock signal generator 28, which comprises a crystalcontrolled oscillator 30 whose output 31 is connected to apply clock pulses to the clock or shift inputs 32 of a three-stage recirculating shift register 33. The respective outputs of the stages of the register 33 are respectively connected via respective pulse shaping amplifiers 34, 35, 36 to the clock inputs 15, 16, 17 of the CCD 12. The respective outputs of the stages of the register 33 are also connected to respective control inputs 37 of a starting and control circuit 38, having respective control outputs 39 which are connected to the respective inputs of each stage of the register 33. The control circuit 38 also has a start input 40, and a control input 41 connected to the output 31 of the oscillator 30. The control circuit 38 includes gates, bistable circuits and counters (not shown) arranged in a conventional manner, and is arranged, in response to a start signal applied to the start signal applied to the start input 40, to load a logic level one signal into the first stage of the register 33, and logic level zero signals into the other two stages thereof. The circuit 38 is also arranged to detect, via its inputs 37, the presence of more than one logic level one signal in the register 33 and to indicate a fault condition in the event of such detection.

The output 24 of the charge transfer device 11 is connected to one contact 43 of the change-over switch 44. The switch 44 has a second contact 45, which is connected to a terminal 46 which constitutes the input terminal of the circuit 10, and a wiper 48 which is movable between the contacts 43, 45. The position of the wiper 48 is controlled by the signal appearing at another control output 50 of the circuit 38, as will hereinafter be described. Although the switch 44 is illustrated as a simple mechanical switch, it will be appreciated that it can in practice be implemented as a solid state switch, e.g., a pair of field effect transistors which are arranged to be alternately rendered conductive.

The wiper 48 of the switch 44 is connected to the input 52 of a quantising circuit 54. The quantising circuit 54 comprises a sample-and-hold circuit 56, which has a signal input 57 connected to the input 52, a control input 58 connected to the output of the amplifier 36, and an output 59 connected to the input 60 of an analogue-to-digital converter 61. The converter 61 may conveniently be of the successive-approximation type, or any other relatively high-speed converter, and has a digitise control input 62 which is connected to the output of the amplifier 35. Additionally the converter 61 has a plurality of digital outputs 63, which are connected to the inputs 64 of a digital-to-analogue converter 65. The converter 65 is conveniently of the resistive ladder-network type, and its output 66 constitutes the output of the quantising circuit 54. The output 66 is connected, via a unity gain buffer amplifier 68 forming part of the circuit 54, to the input 14 of the charge-transfer device 11, so that the device 11 and the quantising circuit 54 together form a closed loop. The output 66 is also connected, via a unity gain buffer amplifier 69 also forming part of the circuit 54, to an output terminal 70 which constitutes the output terminal of the circuit 10.

The operation of the CCD 12 in the charge transfer device 11, under the control of the three-phase clock signal generator 28, is as follows. Once the register 33 is loaded by the circuit 38 in the manner described earlier, the single logic level one signal is continuously recirculated therein by, and at the frequency of, the clock pulses produced by the oscillator 30. The respective outputs of the three stages of the register 33 are thus sequentially energised, and the respective signals appearing at these outputs are each shaped by respective ones of the amplifiers 34, 35, 36 to produce sequential pulses of the form shown in FIGS. 2a), 2b) and 2c). These pulses have a relatively rapid rise time, typically 20 nanoseconds, and a less rapid fall time, typically 100 nanoseconds the rising edge of one pulse substantially coinciding with the start of the falling edge of the preceding pulse so that the pulses are ON together for a short interval such as that indicated at A in FIG. 2. The respective pulses produced by the amplifiers 34, 35, 36 will be referred to as $\phi_1$ pulses, $\phi_2$ pulses and $\phi_3$ pulses respectively, and are applied to respective ones of the three electrodes in each element of the CCD 12 via of the clock inputs 15, 16, 17.

Figure 2:
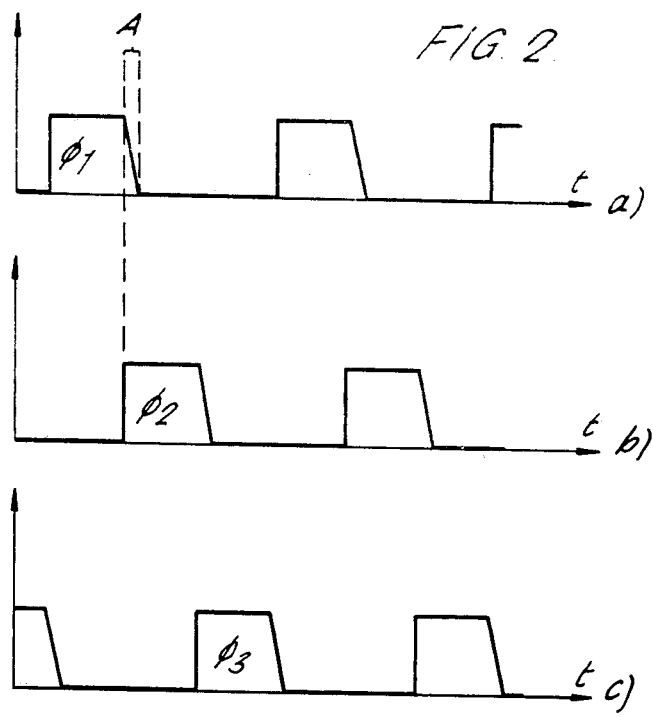
FIGS. 2 and 3 are explanatory diagrams illustrating various aspects of the operation of the circuit of FIG. 1.

During each interval such as A in FIG. 2, when the $\phi_1$ and $\phi_2$ pulses are briefly both ON together as $\phi_1$ is going OFF, a charge substantially proportional to the integral of the magnitude of the voltage at the input 14 over the internal A flows into the first element of CCD 12. Since the period A is very short, this charge may be regarded as proportional to the instantaneous magnitude of the voltage at the input 14, and the CCD 12 effectively samples the voltage at the input 14. During each successive period when two pulses are briefly both ON, the charge is transferred within the CCD 12 from under one electrode to under the next, so for each complete cycle of three clock pulses, the charge is transferred from one element to the next, and a new charge proportional to the instantaneous magnitude of the voltage at the input 14 flows into the first element of the CCD 12. In this way, the CCD 12 can serially store one hundred successive samples of the voltage at the input 14, which voltage may of course be varying.

When each charge reaches the output 18, it appears as a small current pulse in the resistor 25, thus inducing a small voltage pulse across this resistor. The amplitude of the voltage pulse is proportional to, but typically much smaller than, the original voltage at the input 14 represented by the charge. The gain of the amplifier 22 is therefore adjusted so that the amplitude of the voltage pulse produced at its output 24 in response to a given charge appearing at the output 18 is substantially equal to the original voltage at the input 14 represented by that charge.

However, as each charge is transferred from one element to the next within the CCD 12, it experiences a small but significant reduction in magnitude, typically by 0.1 to 0.01%. This can be compensated for to some extent by incorporating amplifying stages, but it cannot be completely eliminated. Thus if the output 24 of the charge-transfer device 11 is directly connected to its input 14 to form a recirculating loop, the errors arising after severl recirculations become unacceptably large.

The circuit 10 of FIG. 1 reduces this problem as follows. An analogue signal to be stored is applied to the input terminal 46, and a start signal is applied to the start input 40 of the circuit 38: the start signal may for example be derived from a trigger circuit (not shown) arranged to be triggered by the analogue input signal when the magnitude of this signal reaches a predetermined threshold. The start signal causes the circuit 38 to load the register 33 as mentioned earlier, thereby starting the three-phase clock signal generator 28, and also causes the circuit 38 to start counting clock pulses from the oscillator 30 and to produce at its ouput 50 a signal which sets the wiper 48 of the switch 44 in contact with the contact 45. The first $\phi_3$ pulse to occur operates the sample and hold circuit 56 via its input 58, causing it to sample the analogue signal at the input terminal 46 via the switch 44, and to hold the instantaneous value thereof. The next $\phi_2$ pulse to occur operates the analogue-to-digital converter 61 via its input 62, causing it to convert the analogue signal held in the circuit 56 into a digital signal representative of the magnitude of the held signal.

Figure 3:
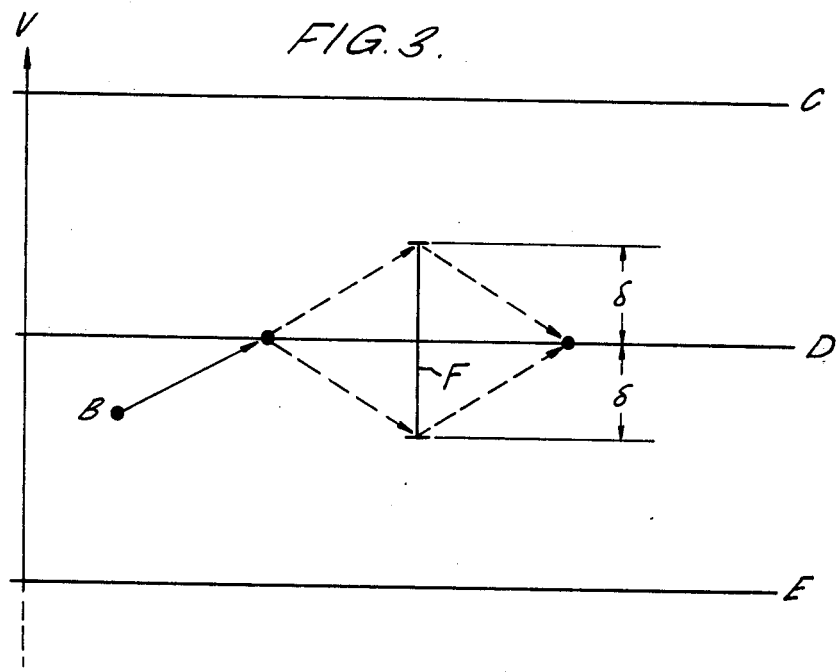

The resolution of the converter 61 is selected to be such that the magnitude of the analogue signal represented by one bit of the digital signal is just greater than twice the total possible change in the magnitude of a full scale analogue signal as a result of one passage through the charge-transfer device 11. Furthermore, the converter 61 is arranged to convert the analogue signal presented to its input 60 to a digital signal whose value most closely corresponds thereto, i.e., the converter 61 rounds upwardly or downwardly as appropriate: this is a conventional technique, and in practice many analogue-to-digital converters are arranged to operate this way. This effect is illustrated graphically in FIG. 3, where the point B represents the actual magnitude of the analogue signal at the input 60 of the converter 61, and the levels C, D and E are three analogue levels corresponding to three successive possible values of the digital signal produced by the converter 61 and successively separated by one bit. Thus the analogue signal whose magnitude is given by B is converted by the converter 61 to a digital signal whose value corresponds to the level neares to B, that is the level D.

The converter 65 immediately converts the digital signal produced by the converter 61 back to an analogue signal whose magnitude is given by the level D, and this analogue signal is applied to the input 14 of the charge-transfer device 11 via the amplifier 68. Thus, when the next $\phi_1$ pulse occurs, a charge proportional to this analogue signal enters the first element of the CCD 12.

This whole sequence of events is repeated 100 times, with successive sequences overlapping each other in time, and a new sample of the analogue signal at the input terminal 46 is entered into the first element of the CCD 12 at the end of each sequence, the preceding samples all being shifted along by one element, until the CCD 12 is full. When the circuit 37 has counted a number of clock pulses from the oscillator 30 corresponding to these 100 sequences, it produces at its output 50 a control signal which sets the wiper 48 of the switch 44 to the position illustrated in FIG. 1, thereby closing the loop formed by the charge-transfer device 11 and the quantising circuit 54. The analogue signals appearing at the output 24 of the charge-transfer device 11 are now successively applied to the quantising circuit 54 via the amplifier 22 and the switch 44, and are processed in the circuit 54 exactly as described earlier.

Considering the analogue signal whose magnitude was originally B, it will be recalled that the quantising circuit 54 changed this magnitude to the level D prior to entering the signal in the charge transfer device 11. After one passage through the device 11, the magnitude of this signal will be D ± δ, where δ is the maximum possible change due to one passage through the device 11: this is illustrated by a vertical line F in FIG. 3. By δ is less than half the separation of adjacent levels such as C, D and E, so after one passage through the charge-transfer device 11 the magnitude of the considered analogue signal is closer to the level D than to the two levels C and E on either side of D. The quantising circuit 54 therefore restores the magnitude of the considered analogue signal back to the level D, and will do this on each circulation of the considered signal round the loop formed by the charge-transfer device 11 and the quantising circuit 54. The same is true for all the other analogue signals, so that after repeated circulations of the signals the change in the magnitude thereof cannot exceed half the separation between adjacent ones of the possible signal levels at the output 66 of the quantising circuit 54.

The analogue signals stored in the circuit 10 can be read out from the terminal 70. By connecting an amplifier with suitable smoothing circuitry to the terminal 70, the complete analogue input signal represented by the hundred samples stored in the circuit 10 can be reproduced.

Figure 4:
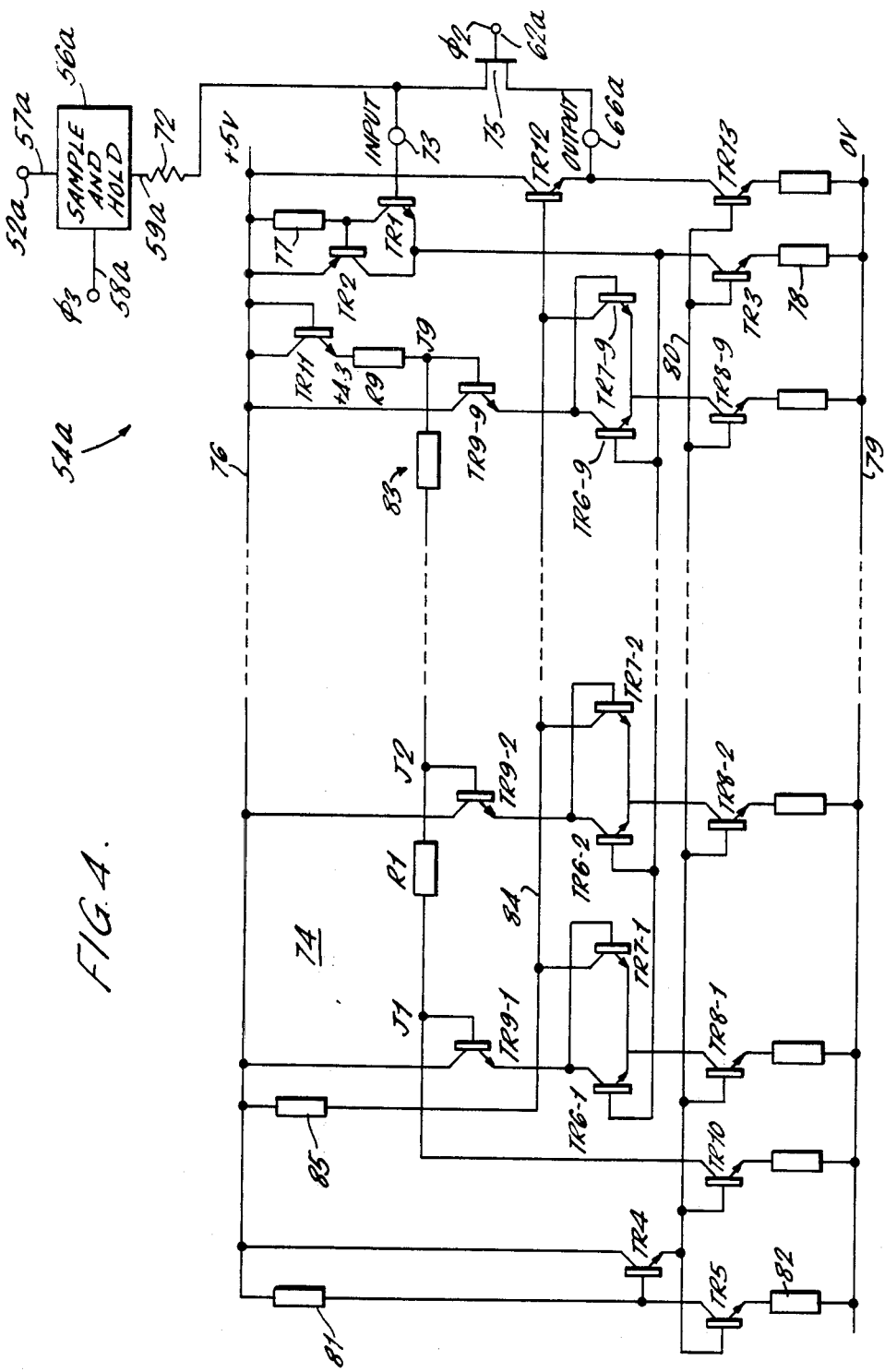
FIG. 4 is a circuit diagram of an alternative embodiment of part of the circuit of FIG. 1.

FIG. 4 shows an alternative form of the quantising circuit 54 of FIG. 1, parts of this alternative form which correspond to like parts in the quantising circuit 54 being given the same reference numbers as were used in FIG. 1 but with the additon of the letter a. Thus the quantising circuit of FIG. 4 is indicated generally at 54a, and comprises a sample-and-hold circuit 56a, which has a signal input 57a connected to the input 52a of the circuit 54a and a control input 58a connected to receive the $\phi_3$ pulses produced by the amplifier 36. The sample-and-hold circuit 56a also has an output 59a, which is connected via a resistor 72 to the input 73 of a quantising amplifier 74. The output of the amplifier 74 constitutes the output 66a of the quantising circuit 54a, and in addition to being connected to the buffer amplifiers 68 and 69 of FIG. 1, is connected via a FET switch 75 to the input 73 of the amplifier 74. The gate of the FET switch 75 is connected to a control input 62a of the circuit 54a, the input 62a being connected to receive the $\phi_2$ pulses produced by the amplifier 35.

The quantising amplifier 74 comprises an input amplifying stage, which comprises in turn an NPN transistor TR1 and a PNP transistor TR2 connected in cascade. The base of the transistor TR1 is connected to the input 73, and the collector of this transistor is connected to a positive voltage supply rail 76 via a resistor 77 and to the base of the transistor TR2. The emitter of the transistor TR1 is connected to the collector of the transistor TR2, and, via an NPN transistor TR3 having an emitter resistor 78 and connected to operate as a constant current source, to a zero volt supply rail 79. The emitter of the transistor TR2 is connected to the rail 76, while the base of the transistor TR3 is connected to receive a substantially constant voltage from a line 80. The voltage on the line 80 is generated by yet another NPN transistor TR4, whose collector is connected to the rail 76, and whose emitter is connected to the line 80. The base of the transistor TR4 is connected to the rail 76 via a resistor 81, and to the rail 79 via another NPN transistor TR5. The transistor TR5 has an emitter resistor 82, and its base is connected to the line 80 to form another constant current source substantially identical to that defined by the transistor TR3.

The emitter of the tansistor TR1 is also connected to the respective bases of nine NPN transistors TR6-1, TR6-2, ..., TR6-9, only three of which are shown for the sake of simplicity. Each of the transistors TR6-1 to TR6-9 forms one of a respective pair of emitter-coupled transistors, the other transistor of each pair being indicated as TR7-1, TR7-2, ..., TR7-9. The commoned emitters of each pair of the transistor TR6, TR7 are connected to the rail 79 via a respective one of nine NPN transistors TR8-1, TR8-2, ..., TR8-9, whose bases are all connected to the line 80 to form constant current sources similar to that defined by the transistor TR3. The collector of each of the transistors TR6 is connected to the base of the transistor TR7 of the same pair, and to the emitter of a respective one of nine NPN transistors TR9-1, TR9-2, ..., TR9-9. The transistors TR9 are arranged as emitter followers, with their collectors connected to the rail 76 and their respective bases connected to respective points J1 to J9 in a potential divider chain 83 comprising nine resistors R1 to R9 connected in series. One end of this potential divider chain, defined by the point J1, is connected to the rail 79 via an NPN transistor TR10, whose base is connected to the line 80 to form yet another constant current source similar to that defined by the transistor TR3. The other end of the potential divider chain 83, defined by one end of the resistor R9, is connected to the emitter of an NPN transistor TR11, which is connected as an emitter following with both its base and collector connected to the rail 76. The collectors of all the transistors TR7 are connected to a common line 84, which is connected via a resistor 85 to the rail 76 and to the base of an NPN transistor TR12. The transistor TR12 is connected as an emitter follower, with its collector connected to the rail 76 and its emitter connected to the rail 79 via an NPN transistor TR13, whose base is again connected to the line 80 to define yet another constant current source similar to that defined by the transistor TR3. The emitter of the transistor TR12 constitutes the output 66a of the amplifier 74 (and of the circuit 54a).

The amplifier 74 is eminently suitable for implementation as an integrated circuit, in which case the emitter resistors of the constant current transistors TR3, TR5, TR8, TR10, TR13, which resistors are provided merely for matching purposes, can be omitted.

The way in which the quantising amplifier 74 operates will now be described. The nine emitter-follower transistors TR9 establish at the respective bases of the transistors TR7 a series of successively increasing voltages, which are determined by the potential divider chain 83. Assuming that the input voltage $V_{in}$ applied to the resistor 72 (connected to the input 73 of the amplifier 74) is initially, at its minimum value, typically about 2 volts, and that the FET switch 75 is held non-conductive, all the transistors TR6 are held in their non-conductive states and all the transistors TR7 are in their conductive states. The current flowing through the resistor 85, which forms the common collector resistor of all the transistors TR7, is therefore at a maximum (nine units of the current established by one of the constant current transistors TR8), so that the voltage $V_{out}$ at the output 66a is also at its minimum value, again about two volts.

Figure 5:
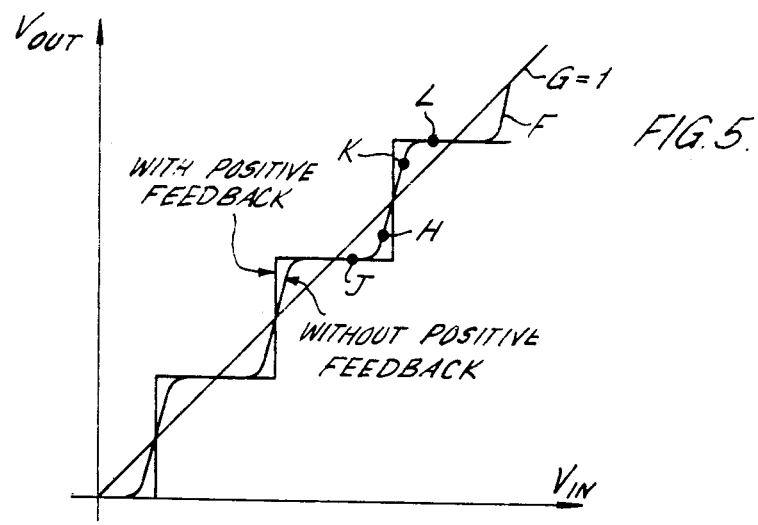
FIG. 5 is an explanatory diagram illustrating an operating characteristic of the circuit of FIG. 4.

As the input voltage $V_{in}$ increases, the voltage applied to the respective bases of the transistors TR6 correspondingly increases, until, at a value of the input voltage determined by the voltage at the junction J1 of the potential divider chain 83, the transistor TR6-1 begins to become conductive. This in turn begins to render the transistor TR7-1 non-conductive, so that over a relatively small range of change in the input voltage $V_{in}$, the first emitter-coupled pair of transistors, TR6-1 and TR7-1, is switched. When the transistor TR7-1 is rendered non-conductive, the current flowing through the resistor 85 is reduced by one unit (i.e. the amount formerly flowing through the transistor TR7-1), and the voltage $V_{out}$ increases correspondingly. As the input voltage $V_{in}$ increases still further, successive pairs of the transistors TR6, TR7 are switched at progressively increasing values of the input voltage, each pair being swiched at a value of the input voltage determined by the voltage at a respective one of the junctions J1 to J9 of the potential divider chain 83. With the FET switch held non-conductive, therefore, the amplifier 74 has an input voltage/output voltage (or gain) characteristic of approximately staircase from, with a mean slop of unity, as shown at F in FIG. 5.

It will be appreciated that portions of this gain characteristic represent a positive gain greater than unity, and other portions represent a positive gain less than unity. If the FET switch 75 is rendered conductive, it establishes a positive feedback path between the output 66a and the input 73 of the amplifier 74. Thus, if the input voltage $V_{in}$ has a value, such as that indicated at H in FIG. 5, which results in an output voltage $V_{out}$ of smaller value, the operation of the positive feedback will almost instantaneously change the output voltage to the nearest horizontal of the gain characteristic below its original value, this portion being indicated at J in FIG. 5. Similarly if the input voltage $V_{in}$ has a value, such as that indicated at K in FIG. 5, which results in an output voltage $V_{out}$ of greater value, the operation of the positive feedback will amost instantaneously change the output voltage to the nearest horizontal portion of the gain characteristic above its original value, this portion being indicated at L in FIG. 1. When the FET switch 75 is conductive, therefore, the voltage at the output 66a of the amplifier 74 has only 10 possible discrete values, each successively higher value resulting from the complete switching of successive pairs of the tansistors TR6, TR7. Thus the quantising circuit 54a of FIG. 4 performs a function exactly analagous to that performed by the quantising circuit 54 of FIG. 1, in that it samples the analogue signal at its input 52a in response to each $\phi_3$ pulse, and converts the sampled signal to the nearest one of the 10 possible discrete values in response to the next-to-occur $\phi_2$ pulse.

Although the embodiment of the quantising amplifier 74 described above produces an output voltage having 10 discrete levels, it will be appreciated it is possible to extend the amplifier to produce more output voltage levels than this, for example 32.

The resolution of the storage circuit 10 of FIG. 1 is determined by the separation of the discrete possible levels at the output of the quantising circuit 54 or 54a, the minimum value of this separation being determined in turn by the total possible change in magnitude of the analogue signal during one passage through the charge-transfer device 11. In order to increase the resolution, two storage circuits may be connected in cascade to form an analogue storage system, as shown in simplified form in FIG. 6. In the two storage circuits of the system of FIG. 6, parts similar to those of the storage circuit 10 of FIG. 1 are given the same reference numerals as were used in FIG. 1 but with the additions of the letters b and c respectively.

Figure 6:
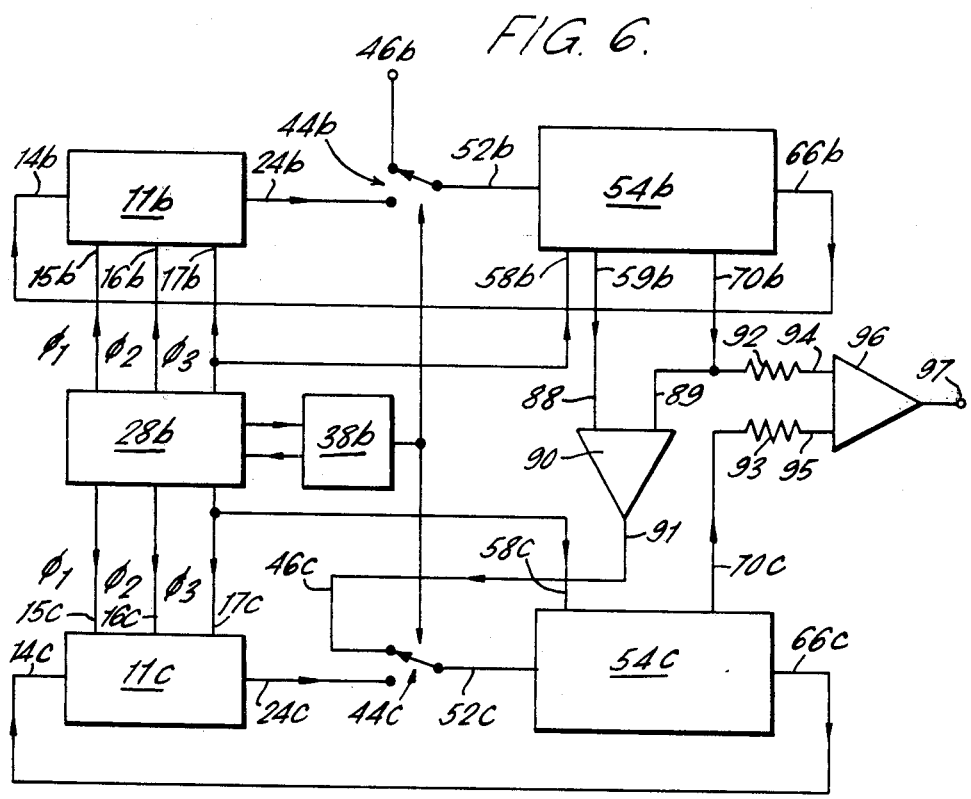
FIG. 6 is a simplified block circuit diagram of an analogue storage system in accordance with the present invention, which system includes two of the circuits of FIG. 1.

Thus the first storage circuit 10b of the system of FIG. 6 comprises a first charge-transfer device 11b, the CCD (not shown) within the charge-transfer device 11b having clock inputs 15b, 16b, 17b connected to receive $\phi_1$, $\phi_2$, $\phi_3$ pulses respectively from a clock pulse generator 28b. The output 24b of the charge-transfer device 11b is connected via a changeover switch 44b to the input 52b of a quantising circuit 54b. An input terminal 46b is also connected via the switch 44b to the input 52b of the circuit 54b.

The quantising circuit 54b may be constituted by either of the embodiments of this circuit described earlier, and includes a sample-and-hold circuit (not shown) having an output 59b. The circuit 54b also has an input 58b connected to receive the $\phi_3$ pulses, and outputs 66b and 70b, and is arranged to produce an output signal having 32 possible discrete levels. The output 66b is connected to the input 14b of the charge-transfer device 11b.

A starting and control circuit 38b is arranged to control the switch 44b and the clock pulse generator 28b, the circuit 38b including means, such as a switchable frequency divider circuit (not shown), for reducing the common frequency of the $\phi_1$, $\phi_2$ and $\phi_3$ pulses during loading of the system with the analogue input signal to be stored.

The outputs 59b and 70b of the circuit 54b are respectively connected to the two inputs 88, 89 of an analogue subtracting amplifier 90 having a gain of 32. The output 91 of the amplifier 90 is connected to the input 14c of the charge-transfer device 11c in the second storage circuit 10c. This second storage circuit is substantially identical to the first, except that the circuit 38b and the clock pulse generator 28b are common to both storage circuits.

The outputs 70b and 70c of the quantising circuits 54b and 54c are connected via respective weighting resistors 92, 93 to the inputs 94, 95 of an analogue summing amplifier 96, which incorporates suitable smoothing circuitry (not shown) and has an output 97 which constitutes the output of the whole storage system.

In operation, the circuit 38b initially sets both switches 44b, 44c to the positions shown in FIG. 6 and sets the common frequency of the $\phi_1$, $\phi_2$ and $\phi_3$ pulses to its reduced value. The analogue input signal to be stored is applied to the input terminal 46b, and is sampled and quantised by the quantising circuit 54b at the beginning of a single $\phi_3$ pulse. The analogue input signal is quantised by the circuit 54b at the one of its 32 possible output levels nearest to the magnitude of the analogue input signal. The subtracting amplifier 90 receives at its inputs 88, 89 the sampled analogue signal before and after quantisation, and thus produces an analogue output signal whose magnitude is equal to 32 times the difference between the magnitude of the signal actually sampled and the magnitude of this signal after quantisation. This output signal is effectively an amplified error signal, representative of the error in the magnitude of the sampled analogue signal introduced by the quantisation of the signal.

The output signal from the amplifier 90 is applied to the input 46c of the storage circuit 10c, and is sampled and quantised by the quantising circuit 54c therein during the same $\phi_3$ pulse. On the occurrence of the immediately succeeding $\phi_1$ pulse, the respective quantised signals at the respecitve outputs 66b, 66c of the quantising circuits 54b, 54c are simultaneously entered into the charge-transfer devices 11b, 11c respectively.

The whole squence of events described in the two preceding paragraphs is repeated in response to each subsequent $\phi_3$ pulse until the storage system contains one hundred samples of the analogue input signal applied to the input terminal 46b, each sample being stored in two parts, a most significant part in the storage circuit 10b and an amplified least significant part in the storage circuit 10c. Thus the resolution of the system is approximately one part in 1000. When the storage system contains 100 samples, the control circuit 38b sets both of the switches 44b, 44c to the other position thereof, thereby closing each loop defined by the charge-transfer devices 11b, 11c and their respective quantising circuits 54b, 54c and allowing the respective parts of the stored signal to circulate round these loops.

The stored analogue signal is reproduced when desired by the amplifier 96. Thus the respective values of the resistors 92, 93 are selected so that the amplifier 96 sums the signal at the output 70b of the quantising circuit 54b with one thirty-second of the signal at the output 70c of the quantising circuit 54c.

It will be appreciated that more than two storage circuits such as the circuits 10b and 10c may be cascaded if desired, each one being connected to store an error signal equal to the product of the difference between the analogue input signal and the quantised version thereof from the preceding storage circuit and a constant multiplying factor greater than unity. In this case, to reproduce the original analogue signal, each part thereof in the respective storage circuits is appropriately scaled by dividing it by the product of the multiplying factors associated with the preceding storage circuits, and the scaled parts are then summed. Since a digital output signal is available from each quantising circuit such as the circuit 54, this scaling and summing can be effected digitally, but an analogue method similar to that described in relation to FIG. 6 is preferred.

Figure 7:
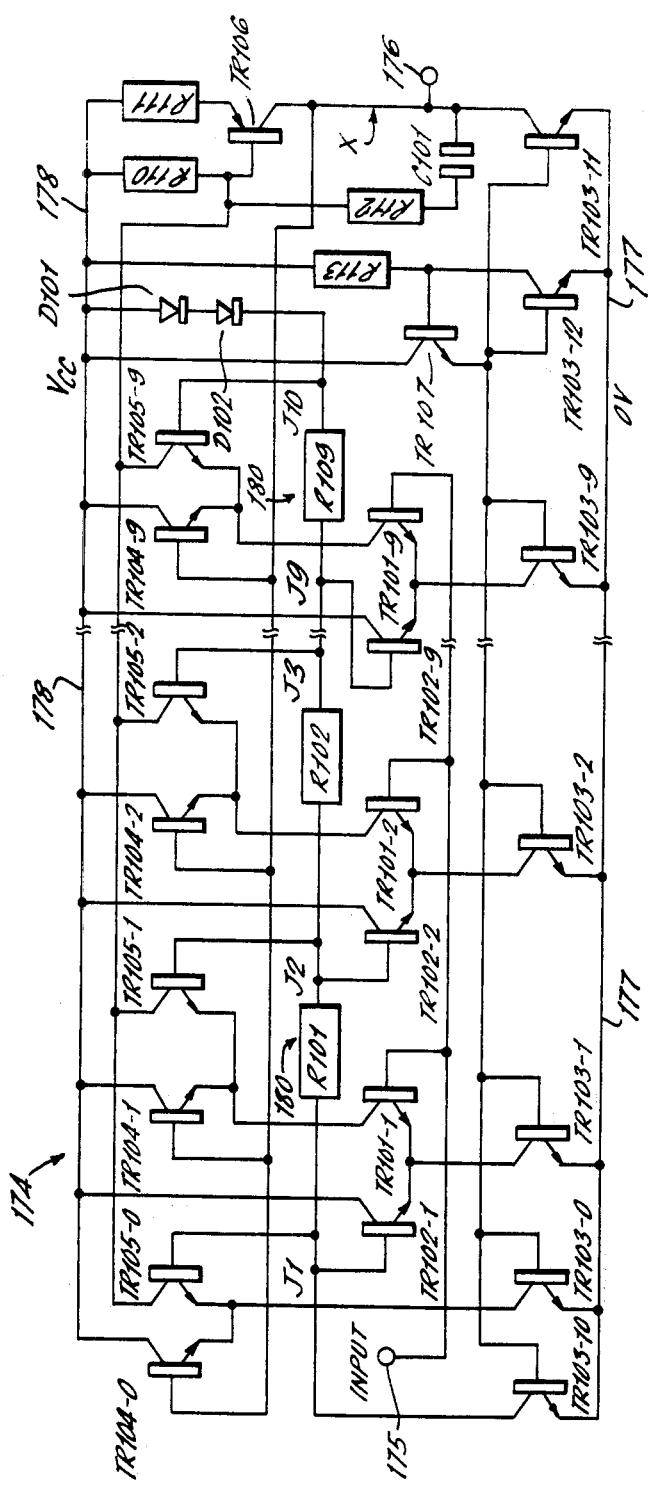
FIG. 7 is a circuit diagram of an alternative embodiment of part of the circuit of FIG. 4.

FIG. 7 shows, at 174, an alternative form of the quantising amplifier 74 of FIG. 4. The quantising amplifier 174 has an input 175 and an output 176 which respectively correspond to the input 73 and output 66a of the quantising amplifier 74 of FIG. 4.

The input 175 is connected to the respective bases of nine transistors TR101-1 to TR101-9, of which only three are shown in FIG. 7 for the sake of clarity. Each of the transistors TR101-1 to TR101-9 forms one transistor of a respective emitter-coupled pair of transistors, the other transistors of these emitter-coupled pairs being indicated at TR102-1 to TR102-9 respectively. The commoned emitters of each of the emitter-coupled pairs TR101-1, TR101-2 to TR101-9, TR102-9 are connected, via respective transistors TR103-1 to TR103-9 each arranged to operate as a constant current source, to a zero volt power supply rail 177, while the respective collectors of the transistors TR102-1 to TR102-9 are all connected to a positive power supply rail 178.

The respective bases of the transistors TR102-1 to TR102-9 are connected to respective junctions J1 to J9 of a resistive potential divider chain 180, which comprises nine substantially equal resistors R101 to R109. The resistor R109 is connected to the rail 178 via two forward-biassed diodes D101, D102, while the resistor R101 is connected to the rail 177 via a transistor TR103-10 arranged to operate as a constant current source. The junctions J1 to J9 are respectively situated at the ends of the resistors R101 to R109 nearer to the transistor TR103-10 and the rail 177, i.e. at the lower-voltage end of the respect resistor, and a further junction J10 is provided between the resistor R109 and the diodes D101, D102, i.e. at the higher-voltage end of the resistor R109. The values of the resistors R101-R109 and the total voltage drop thereacross are chosen to be such that the voltage drop across each resistor is just greater than the saturation voltage of any of the transistors TR101.

The respective collectors of the transistors TR101-1 to TR101-9 are each connected to the commoned emitters of a respective one of nine further emitter-coupled pairs of transistors TR104-1, TR105-1, to TR104-9 TR105-9. The respective collectors of the transistors TR104-1 to TR104-9 are connected to the rail 178, while the respective bases thereof are connected to the collector of a PNP transistor TR106. The respective bases of the transistors TR105-1 to TR105-9 are respectively connected to the junctions J2 to J10 of the potential divider chain 180, while the respective collectors thereof are connected on the one hand to the base of the transistor TR106, and on the other hand to the rail 178 via a common resistor R110.

A further emitter-coupled pair of transistors TR104-0, TR105-0 is provided, the collector of the transistor TR104-0 being connected to the rail 178 and the base thereof being connected to the collector of the transistor TR106. The commoned emitters of the transistors TR104-0 and TR105-0 are connected via yet another constant current source transistor TR103-0 to the rail 177. The base of the transistor TR105-0 is connected to the junction J1 of the potential divider chain 180, while the collector thereof is commoned with the collectors of the transistors TR105-1 to TR105-9.

The transistor TR106, which operates as a simple grounded-emitter type amplifier, has its emitter connected to the rail 178 via a resistor R111. The collector of the transistor TR106 constitutes the output 176, and is connected via another constant current source transistor TR103-11 to the rail 177. The series combination of a resistor R112 and a capacitor C101 is connected between the base and the collector of the transistor TR106 to eliminate the possibility of high frequency oscillation.

The respective bases of the constant current source transistors TR103-0 to TR103-11 are commoned and connected to the emitter of an emitter-follower transistor TR107, whose collector is connected to the rail 178 and whose base is connected to the rail 178 via a resistor R113. The base of the transistor TR107 is also connected via a yet further constant current transistor TR103-12, to the rail 177, the base of the transistor TR103-12 being commoned with the bases of all the other constant current source transistors TR103.

All the transistors are NPN transistors except the transistor TR106. The amplifier 174 is again eminently suitable for implementation as an integrated circuit, in which case the capacitor C101 and resistor R112 may be unnecessary.

The operation of the quantising amplifier 174 will now be described. With the input voltage $V_{in}$ applied to the input 175 at its normal minimum value (about 1 volt), all the transistors TR101-1 to TR101-9 are non-conductive, while all the transistors TR102-1 to TR102-9 are conductive. Thus all the emitter-coupled pairs TR104-1, TR105-1 to TR104-9, TR105-9 are inoperative. However, the biassing of the transistor TR106, and in particular the value of the resistor R110, is arranged to be such that the resistor R110 draws a current equal to half the current drawn through the transistor TR106 by its constant current source transistor TR103-11, so that the emitter-coupled pair TR104-0, TR105-0 is operative. The transistors TR104-0, TR105-0, which together constitute a differential amplifier, co-operate with the transistor TR106 to form a closed negative-feedback loop, which operates to maintain the output voltage at the collector of the transistor TR106, i.e., at the output 176, equal to the voltage at the base of the transistor TR105-0, i.e., equal to the voltage at the junction J1 of the potential divider chain 180.

As the input voltage $V_{in}$ increases, the output voltage does not change significantly until $V_{in}$ begins to exceed the voltage at the junction J1 of the potential divider chain 180, causing the transistor TR101-1 to become conductive. The emitter-coupled pair TR104-1, TR105-1 is rendered operative by the transistor TR101-1, and the increased current drawn through the resistor R110 by the transistor TR105-1 increases the output voltage at the output 176. This increased output voltage renders the transistor TR104-0 fully conductive and the transistor TR105-0 non-conductive, so that the differential amplifier constituted by these two transistors is effectively rendered inoperative. It is the differential amplifier constituted by the transistors TR104-1 and TR105-1 which then forms a closed negative-feedback loop with the transistor TR106. However, this new loop operates to maintain the output voltage at the output 106 equal to the voltage at the base of the transistor TR105-1, i.e. equal to the voltage at the junction J2 of the potential divider chain 180.

The transition of the amplifier 174 from the state where the output voltage is determined by the voltage at the junction J1 to the state where the output voltage is determined by the voltage at the junction J2 takes place over a relatively small range of the value of the input voltage $V_{in}$. Thereafter, the output voltage again does not change significantly as the input voltage $V_{in}$ increases, until $V_{in}$ begins to exceed the voltage at the junction J2 of the potential divider chain 180. Then, in a manner exactly analogous to that described in the preceding paragraph, the differential amplifier constituted by the emitter-coupled pair TR104-2, TR105-2 is rendered operative, the transistors TR104-1 and TR105-1 become fully conductive and non-conductive respectively, rendering the differential amplifier constituted thereby effectively inoperative, and the output voltage increases to, and is maintained at, the voltage at the junction J3 of the potential divider chain 180. As the input voltage $V_{in}$ increases still further, the emitter-coupled pairs TR104-3, TR105-3 to TR104-9, TR105-9 are successively rendered operative and the output voltage is successively determined by the respective voltages at the junctions J4-J10 of the potential divider chain 180. The amplifier 174 thus has an input voltage/output voltage characteristic of approximately staircase form, similar to that shown at F in FIG. 5 for the amplifier 74. However, the mean gain is inherently equal to unity for the amplifier 174, since the potential divider 180 determines both the values of the input voltage $V_{in}$ at which transitions occur, and the values of the output voltage $V_{out}$ which result from these transitions.

It will be appreciated that there is a small offset between the output voltage $V_{out}$ and the input voltage $V_{in}$. In order to apply positive feedback between the output 176 and the input 175, as was described in relation to the amplifier 74 of FIG. 4, it is necessary to eliminate this offset. One simple way of doing this is to insert a relatively low value resistor between the respective collectors of the transistors TR106 and TR103-11, in the position indicated at X in FIG. 7, and to use the collector of the transistor TR103-11 as the output 176. Then, with positive feedback applied as described in relation to the amplifier 74 of FIG. 4, the output voltage $V_{out}$ will take only ten possible discrete values. Again, it will be appreciated that it is a simple matter to modify the amplifier 174, by increasing or decreasing the number of stages such as TR101-1, TR102-1, TR103-1, TR104-1, TR105-1, R101, to produce an output voltage having more or less than ten possible discrete values.

The quantising amplifier 174 can be modified in several different ways. For example, the emitter-coupled pairs TR104, TR105 can be connected in the collectors of the transistor TR102 so as to be successively de-energised as the input voltage increases, in which case their respective collector connections are interchanged. Alternatively, the respective differential amplifiers constituted by the emitter-coupled pairs TR104, TR105 can be replaced by respective voltage follower circuits of a more simple kind, e.g. emitter followers, coupled to a common output circuit which reproduces (or responds to) the highest or lowest input voltage applied thereto.

Many other modifications can be made to the described embodiments of the invention. For example, in the FIG. 1 embodiment, the analogue input signal to be stored can be applied to the input 14 and sampled by the CCD 12 in the charge-transfer device 11. This increases the possible error in the stored analogue signal after repeated circulations by the magnitude of the change due to one passage of the signal through the charge-transfer device 11. However, this disadvantage may be offset by the fact that it is possible to cause the CCD 12 to sample at very high frequencies (some charge-coupled devices can operate at frequencies of about 1 GHz): a signal sampled at such a high frequency could then be circulated for storage and readout purposes at a much lower frequency, by changing the frequency of the $\phi_1$, $\phi_2$, $\phi_3$ pulses as described earlier. Also, where the change in an analogue signal as a result of one passage through the charge-transfer device 11 is proportional to the original magnitude of the analogue signal, the quantising circuit may include a logarithmic amplifier connected to amplify the analogue signal received from the device 12 prior to quantisation thereof. This renders the magnitude of the possible error at the input of the quantising circuit 54 substantially constant. To compensate for the presence of the logarithmic amplifier, an exponential amplifier, that is a circuit which in response to an input signal of magnitude x produces an output signal of magnitude $e^x$, is provided at the output of the quantising circuit. Such an exponential amplifier is relatively easy to implement since the gain characteristics of a transistor typically approximate quite closely to an exponential law.

Moreover, the quantising circuit 54a of FIG. 4 can be modified by applying a common reference voltage to the base of one transistor in each of a plurality of emitter-coupled pairs of transistors, and applying the input signal $V_{in}$ via a potential divider chain to the respective bases of the other transistors in the emitter-coupled pairs. Thus the potential divider chain has a plurality of outputs at each of which successively smaller proportions of the input voltage $V_{in}$ appear, and each output is connected to the base of a respective one of the other transistors. Also, where the quantising circuit 54a of FIG. 4 is used in a single-stage storage circuit such as that shown in FIG. 1, the positive feedback path comprising the FET switch 75 can be omitted, since repeated recirculations of the output voltage $V_{out}$ produced by the circuit 54a through the charge-transfer circuit 11 have the same effect, albeit more slowly, as that produced by the positive feedback path.

What is claimed is:

1. An analogue storage circuit comprising:
   a charge transfer device having an input whereby an analogue signal may be introduced into the device, an output, and means whereby the analogue signal may be shifted from the input to the output, the analogue signal being subject to a change in magnitude during said shifting;
   a quantising circuit for receiving the analogue signal from the output of the charge transfer device and for quantising the received analogue signal at a respective one of a plurality of substantially discrete levels, the particular level at which said signal is quantised being one of two of the discrete levels between which the magnitude of the received analogue signal lies, the particular level being the one nearest to the magnitude of the received analogue signal, the separation of each pair of adjacent discrete levels being not less than twice the magnitude of said change in analogue signals whose magnitude lies between that pair of levels, the quantising circuit being arranged to apply the quantised analogue signal to the input of the charge transfer device, whereby in operation the analogue signal is circulated round the loop defined by the charge transfer device and the quantising circuit, the quantising circuit being further arranged to quantise the analogue signal, upon each subsequent receipt thereof, at the same one of said discrete levels; and
   input means for introducing an analogue input signal to be stored into the loop defined by the charge transfer device and the quantising circuit.

2. An analogue storage circuit as claimed in claim 1, wherein the discrete levels are $2^n$ in number and are uniformly spaced apart.

3. An analogue storage circuit as claimed in claim 1, wherein the quantising circuit comprises an analogue-to-digital converter for converting the received analogue signal to a digital signal, and a digital-to-analogue converter for converting the digital signal back into analogue form, said analogue form constituting the quantised analogue signal.

4. An analogue storate circuit as claimed in claim 3, wherein the analogue-to-digital converter is arranged to convert the received analogue signal to a digital signal whose value is the nearest possible value corresponding to the magnitude of the received analogue signal, whereby each possible value of the digital signal corresponds to a respective one of said possible levels.

5. An analogue storage circuit as claimed in claim 3, wherein the analogue-to-digital converter is arranged to convert the received analogue signal to a digital signal whose value is the nearest possible value beneath the theoretical value corresponding to the magnitude of the received analogue signal, and there is provided means for increasing the magnitude of the quantised analogue signal by an amount corresponding to half the difference between the possible values of the digital signal.

6. An analogue storage circuit as claimed in claim 1, wherein the quantising circuit comprises a non-linear amplifying circuit whose gain varies approximately in accordance with a staircase function and has a mean value of one.

7. An analogue storage circuit as claimed in claim 6, wherein the amplifying circuit comprises a plurality of signal level responsive circuits, each adapted to change from a first state to a second state in the region of a level corresponding to a respective one of said discrete levels, and summing means responsive to said level responsive circuits for producing an output signal whose level is dependent upon the number of said level responsive circuits in a given one of said states.

8. An analogue storage circuit as claimed in claim 7, wherein each signal level responsive circuit comprises a respective emitter-coupled pair of transistors.

9. An analogue storage circuit as claimed in claim 6, wherein the amplifying circuit includes a positive feedback circuit, whereby said output signal may take only one of a plurality of discrete levels.

10. An analogue storage circuit as claimed in claim 9, wherein the feedback circuit comprises switching means for directly connecting the output of the amplifying circuit to the input thereof.

11. An analogue storage circuit as claimed in claim 1, wherein the quantising circuit includes a sample-and-hold circuit for sampling and holding the received analogue signal prior to quantising thereof.

12. An analogue storage circuit as claimed in claim 1, wherein the quantising circuit includes a logarithmic amplifier connected to amplify the received analogue signal prior to quantising thereof, and an exponential amplifier connected to amplify the quantised analogue signal.

13. An analogue storage circuit as claimed in claim 1, wherein the input means is constituted by the input of the charge storage device.

14. An analogue storage circuit as claimed in claim 1, wherein the input means is constituted by the input of the quantising circuit.

15. A multiple stage analogue storage system comprising N storage circuits in accordance with claim 1, where $N \geq 2$, connected in cascade by $(N-1)$ analogue subtracting circuits each having two inputs and an output which is connected to the input of a respective analogue multiplying circuit having a respective multiplying factor greater than unity, the two inputs of each subtracting circuit being respectively connected to receive the analogue input signal and the quantised signal from the preceding storage circuit, and the output signal from each multiplying circuit constituting the analogue input signal for the succeeding storage circuit, whereby portions of the analogue input signal to be stored, which portions are of successively decreasing significance, are stored in successive ones of the storage circuits.

16. An analogue storage system as claimed in claim 15, wherein the respective input means of at least the first $N-1$ storage circuits are constituted by the respective inputs of their respective quantising circuits.

17. An analogue storage system as claimed in claim 15 wherein the respective multiplying factors of the multiplying circuits are all the same.

18. An analogue storage system as claimed in claim 15, further comprising an output circuit for producing an output signal representative of the magnitude of the stored analogue signal, the output circuit comprising means operative to implement the equation $$S = S_1 + (S_2/a) + (S_3/b) + \ldots (S_N k)$$

where $S_1$ to $S_N$ are the respective magnitudes of the signals in the first to the Nth storage circuits, $a, b, \ldots$ and $k$ are respective scaling factors appropriate to the second to the Nth storage circuits, and for a given storage circuit are equal to the product of the multiplying factors of the multiplying circuits preceding that storage circuit, and $S$ is the magnitude of the output signal.

19. An analogue storage system as claimed in claim 18, wherein the output circuit comprises analogue dividing means connected to divide each of the respective signals in the second to Nth storage circuits by the appropriate one of the factors $a, b, \ldots k$, and analogue summing means connected to sum the divided signals with the signal in the first storage circuit to produce said output signal.

20. An analogue storage circuit comprising:
a multi-stage charge transfer device having an input whereby an analogue signal may be introduced into the device, an output, and means whereby an analogue signal introduced into the device may be shifted from said input, through successive stages of the device, to appear at said output, the magnitude of such an analogue signal appearing at said output being subject to an undesired variation;
a quantising circuit arranged to quantise each signal applied thereto at a respective one of a plurality of substantially discrete levels in dependence upon the magnitude of the applied signal, the quantising circuit being connected between the output and the input of the charge transfer device to form a closed loop therewith; and
means for introducing an analogue signal to be stored into said loop for circulation therearound;
the separation of each pair of adjacent discrete levels being not less than $2\delta/K$, where $\pm\delta$ is the magnitude of said undesired variation in analogue signals whose magnitude lies between that pair of levels and K is the gain factor of the charge transfer device for analogue signals whose magnitude lies between that pair of discrete levels; and
the quantising circuit being arranged:
a. to quantise the analogue signal appearing at the output of the charge transfer device after the first passage of the analogue signal through the device either at one of the two adjacent discrete levels between which its magnitude lay prior to said first passage or, if the analogue signal is quantised at a discrete level prior to said first passage, at the same discrete level; and
b. to quantise the analogue signal, upon each subsequent receipt thereof, at the same one of said discrete levels.

21. An analogue storage circuit as claimed in claim 20, wherein said one level is the one nearest to the magnitude of the analogue signal prior to said first passage.

22. An analogue storage circuit as claimed in claim 20, wherein the charge transfer device has substantially unity gain, and the separation of each pair of adjacent discrete levels is not less than 2δ, where ±δ is the magnitude of said undesired variation for analogue signals whose magnitude lies between that pair of levels.

23. An analogue storage circuit as claimed in claim 21, wherein the charge transfer device has substantially unity gain, and the separation of each pair of adjacent discrete levels is not less than 2δ, where ±δ is the magnitude of said undesired variation for analogue signals whose magnitude lies between that pair of levels.

* * * * *